(12) United States Patent
Liu et al.

(10) Patent No.: US 11,894,283 B2
(45) Date of Patent: Feb. 6, 2024

(54) DISPLAY SUBSTRATE AND METHOD FOR PREPARATION THEREOF, AND DISPLAY DEVICE

(71) Applicant: BOE Technology Group Co., Ltd., Beijing (CN)

(72) Inventors: Yingming Liu, Beijing (CN); Haisheng Wang, Beijing (CN); Xiaoliang Ding, Beijing (CN); Lei Wang, Beijing (CN); Pengpeng Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 495 days.

(21) Appl. No.: 17/288,747

(22) PCT Filed: May 25, 2020

(86) PCT No.: PCT/CN2020/092173
§ 371 (c)(1),
(2) Date: Apr. 26, 2021

(87) PCT Pub. No.: WO2020/244409
PCT Pub. Date: Dec. 10, 2020

(65) Prior Publication Data
US 2021/0398876 A1     Dec. 23, 2021

(30) Foreign Application Priority Data

Jun. 6, 2019   (CN) .......................... 201910489880.6

(51) Int. Cl.
*H01L 23/00*     (2006.01)
*H01L 23/373*    (2006.01)
*H01L 27/12*     (2006.01)
*H10K 59/126*    (2023.01)
*H10K 59/121*    (2023.01)
*H10K 59/12*     (2023.01)

(52) U.S. Cl.
CPC ........ *H01L 23/373* (2013.01); *H01L 27/1218* (2013.01); *H10K 59/126* (2023.02); *H10K 59/1213* (2023.02); *H10K 59/1201* (2023.02)

(58) Field of Classification Search
CPC ............ H10L 27/1218; H10K 59/1213; H10K 59/126
See application file for complete search history.

(56) References Cited

U.S. PATENT DOCUMENTS 5,583,369 A      12/1996  Yamazaki et al.
2004/0232554 A1  11/2004  Hirano et al.
(Continued)

FOREIGN PATENT DOCUMENTS

CN      1127937 A     7/1996
CN    101740671 A     6/2010
(Continued)

OTHER PUBLICATIONS

CN201910489880.6 First Office Action.

*Primary Examiner* — Anthony Ho
(74) *Attorney, Agent, or Firm* — IPro, PLLC

(57) ABSTRACT

The embodiments of the present application provide a display substrate and method for preparation thereof, and a display device. The display substrate includes a base, a piezoelectric layer arranged on the base, and a thin-film transistor arranged on the piezoelectric layer, said piezoelectric layer being configured to convert heat generated by the thin-film transistor into sound waves.

16 Claims, 2 Drawing Sheets

(56) References Cited

U.S. PATENT DOCUMENTS

| | | |
|---|---|---|
| 2013/0301218 A1 | 11/2013 | Li et al. |
| 2014/0145164 A1 | 5/2014 | Odaka et al. |
| 2019/0043891 A1 | 2/2019 | Li et al. |
| 2020/0067012 A1 | 2/2020 | Su et al. |
| 2020/0075882 A1 | 3/2020 | Wang et al. |

FOREIGN PATENT DOCUMENTS

| | | |
|---|---|---|
| CN | 105810717 A | 7/2016 |
| CN | 107634068 A | 1/2018 |
| CN | 207199630 U | 4/2018 |
| CN | 109148482 A | 1/2019 |
| CN | 109148721 A | 1/2019 |
| CN | 109841581 A | 6/2019 |
| CN | 110190071 A | 8/2019 |

DISPLAY SUBSTRATE AND METHOD FOR PREPARATION THEREOF, AND DISPLAY DEVICE

CROSS REFERENCE TO RELATED APPLICATIONS

The present disclosure is a National Stage of International Application No. PCT/CN2020/092173, filed on May 25, 2020, which claims priority of Chinese Patent Application No. 201910489880.6 filed to the China Patent Bureau on Jun. 6, 2019, entitled 'DISPLAY SUBSTRATE AND METHOD FOR PREPARATION THEREOF, AND DISPLAY DEVICE', the entire contents of which are incorporated herein by reference.

FIELD

The present disclosure relates to the technical field of display, and particularly relates to a display substrate and a method for preparation thereof, and a display device.

BACKGROUND

A thin-film transistor (TFT) is a very important element in the technical field of display, and takes a very important effect in a liquid crystal display (LCD) and an organic light emitting diode (OLED). With the improvement of display quality, there are higher and higher requirements for uniformity and dependence of a threshold voltage Vth of the TFT, and thus, how to suppress the drift of the threshold voltage Vth is one of important subjects for further improving the display quality.

SUMMARY

An embodiment of the present disclosure provides a display substrate, including a base, a piezoelectric layer arranged on the base, and TFTs arranged on the piezoelectric layer, the piezoelectric layer being configured to convert heat generated by the TFTs into sound waves.

Optionally, a material of the piezoelectric layer includes lead zirconate titanate piezoelectric ceramic composite crystals, zinc oxide, aluminium nitride or polyvinylidene fluoride.

Optionally, a thickness of the piezoelectric layer is 1 µm to 20 m.

Optionally, orthogonal projections of the TFTs on the base are in an orthogonal projection of the piezoelectric layer on the base.

Optionally, the TFTs includes top-gate-type TFTs, and active layers of the TFTs are in direct contact with the piezoelectric layer.

Optionally, the display substrate further includes a shielding layer, the shielding layer being arranged between the base and the piezoelectric layer.

Optionally, a material of the shielding layer includes a metal material.

Optionally, the shielding layer includes shielding blocks in one-to-one correspondence to the TFTs, and orthogonal projections of the shielding blocks on the base overlap with orthogonal projections of the TFTs corresponding to the shielding blocks on the base.

Optionally, orthogonal projections of channel regions of the TFTs on the base are in the orthogonal projections of the shielding blocks corresponding to the TFTs on the base.

Optionally, the display substrate further includes an electrode lead connected with the shielding layer, the electrode lead being connected with a peripheral circuit and being configured to apply a voltage to the shielding layer.

An embodiment of the present disclosure further provides a display device, including the above-mentioned display substrate.

In order to solve the above-mentioned technical problems, an embodiment of the present disclosure further provides a method for preparation of a display substrate, including:

forming a piezoelectric layer on a base; and
forming TFTs on the piezoelectric layer, and enabling the piezoelectric layer to convert heat generated by the TFTs into sound waves.

Optionally, a material of the piezoelectric layer includes lead zirconate titanate piezoelectric ceramic composite crystals, zinc oxide, aluminium nitride or polyvinylidene fluoride.

Optionally, a thickness of the piezoelectric layer is 1 µm to 20 µm.

Optionally, before the forming the piezoelectric layer on the base, the method further includes:

forming a shielding layer on the base.

Optionally, a material of the shielding layer includes a metal material.

BRIEF DESCRIPTION OF THE DRAWINGS

Accompanying drawings are used for providing further understanding on the technical solutions of the present disclosure, constituting a part of this specification, and explaining the technical solutions of the present disclosure together with the embodiments of the present disclosure, but do not constitute limitations to the technical solutions of the present disclosure. The shape and size of each component in the accompanying drawings do not reflect a true scale, but just aim to schematically illustrate the contents of the present disclosure.

DETAILED DESCRIPTION OF THE EMBODIMENTS

Figure 1:
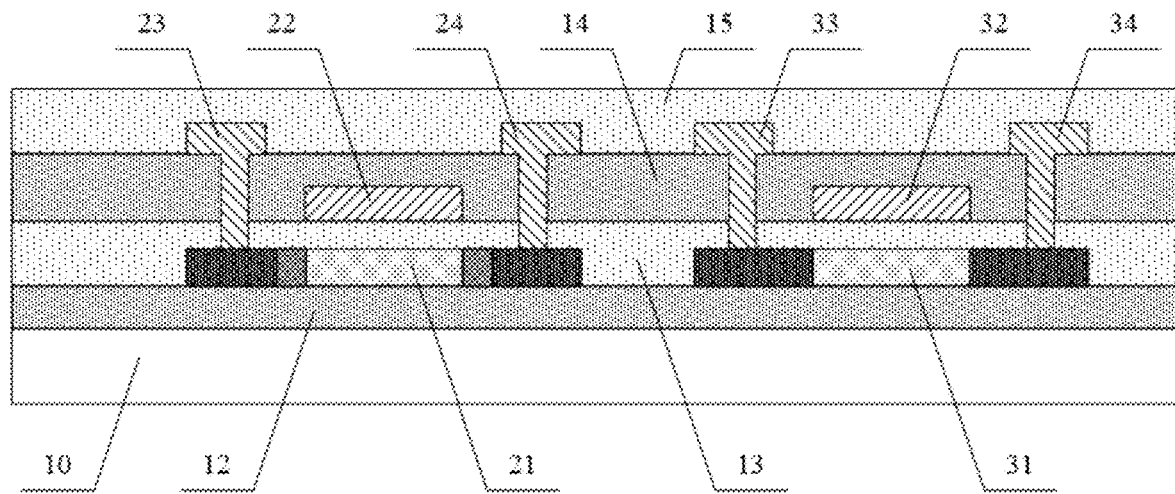
FIG. 1 is a structural schematic diagram of one embodiment of a display substrate provided by the present disclosure.

In order to overcome the defect that the temperature rise of TFTs causes the drift of threshold voltages Vth, a solution of arranging a metal copper thin film on the back of a display substrate is proposed in the prior art, so that the temperature of the TFTs is reduced by utilizing the good heat dissipation characteristic of the copper thin film. However, an inventor of the present disclosure finds by research that there are structures such as a buffer layer and a base between the copper thin film and each of the TFTs, and thus, an existing solution cannot solve the problem of different drift degrees of the threshold voltages Vth of the TFTs at different positions. In view of this, the present disclosure provides a display substrate and a method for preparation thereof, and a display device so as to solve the problem of different drift degrees of the threshold voltages Vth of the TFTs at different positions of an existing display substrate.

The specific implementation modes of the present disclosure will be described in detail below in connection with the accompanying drawings and embodiments. The following embodiments are merely used for illustrating the present disclosure, but not used for limiting the scope of the present disclosure. It should be noted that, in case of no conflict, the embodiments of the present disclosure and the characteristics in the embodiments can be randomly combined with each other.

The inventor of the present disclosure finds by research that the self-heating effect not only can cause the drift of the threshold voltages Vth of the TFTs, but also can cause different drift degrees of the threshold voltages Vth of different TFTs, and such a difference influences the display stability of a display panel to a certain degree. In a working process of the TFTs, when a certain row needs to be turned on, a high voltage signal needs to be applied to a gate electrode to turn on the TFTs, for example, a voltage of 8V or a higher voltage is applied; and when a certain row needs to be turned off, a low voltage signal needs to be applied to the gate electrode to turn off the TFTs, for example, a voltage of −8V or a lower voltage is applied. In this way, a current may flow through the gate electrode in a process of applying the high and low voltages, and part of energy can be converted into corresponding heat. Meanwhile, when the TFTs are turned on, a voltage such as a voltage of +5V or −5V can be input to a source electrode, and in the long-time inputting process, corresponding heat can be generated in a channel region between the source electrode and a drain electrode, resulting in the temperature rise of the channel regions. There are different gray scales required to be displayed at different positions of the display panel and currents transmitted in the channel regions are different, so the TFTs at different positions generate different heat, and the temperature rise degrees of the channel regions of the TFTs are different, resulting in different degrees of drift of the threshold voltages Vth of the TFTs at different positions.

The inventor of the present disclosure finds by further research that the existing solution of arranging the copper thin film can merely improve the temperature rise of a related interface of the gate electrode, but cannot reduce the temperatures of the channel regions of the TFTs; and the buffer layer is spaced between the copper thin film and each of the TFTs, and the buffer layer with poor heat conductivity reduces heat conduction efficiency, resulting in that not only can the temperatures of the channel regions of the TFTs not be reduced, but also the temperature difference of the TFTs at different positions cannot be eliminated, and thus, the existing solution cannot solve the problem of different drift degrees of the threshold voltages Vth of the TFTs at different positions.

In order to solve the problem of different drift degrees of the threshold voltages Vth of the TFTs at different positions of the existing display substrate, an embodiment of the present disclosure provides a display substrate. The display substrate includes a base, a piezoelectric layer arranged on the base, and TFTs arranged on the piezoelectric layer, the piezoelectric layer being configured to convert heat generated by the TFTs into sound waves.

In some embodiments, the display substrate further includes a shielding layer, the shielding layer being arranged between the base and the piezoelectric layer, namely, the shielding layer being arranged on the base, and the piezoelectric layer being arranged on the shielding layer.

Optionally, a material of the piezoelectric layer includes lead zirconate titanate piezoelectric ceramic composite crystals, zinc oxide, aluminium nitride or polyvinylidene fluoride.

Optionally, the thickness of the piezoelectric layer is 1 μm to 20 μm.

In some embodiments, orthogonal projections of the TFTs on the base are positioned in an orthogonal projection of the piezoelectric layer on the base. Namely, the orthogonal projection of the piezoelectric layer completely covers the orthogonal projections of the TFTs, so that the heat of the TFTs can be more efficiently transferred to the piezoelectric layer and converted into the sound waves.

In some embodiments, the TFTs include top-gate-type TFTs, and active layers of the TFTs are in direct contact with the piezoelectric layer, so that the heat of channel regions of the TFTs can be more efficiently transferred to the piezoelectric layer and converted into the sound waves.

In some embodiments, a material of the shielding layer includes a metal material. The shielding layer made of the metal material can improve sound wave conversion efficiency of the piezoelectric layer so as to improve heat dissipation efficiencies of the TFTs.

In some embodiments, the shielding layer includes shielding blocks in one-to-one correspondence to the TFTs, and orthogonal projections of the shielding blocks on the base overlap with orthogonal projections of the TFTs corresponding to the shielding blocks on the base.

In some embodiments, orthogonal projections of the channel regions of the TFTs on the base are positioned in the orthogonal projections of the shielding blocks corresponding to the TFTs on the base.

In some embodiments, the display substrate further includes an electrode lead connected with the shielding layer, the electrode lead being connected with a peripheral circuit and being configured to apply a voltage to the shielding layer.

According to the display substrate provided by some embodiments of the present disclosure, the piezoelectric layer is arranged between the base and each of the TFTs, and the piezoelectric layer is used for converting the heat generated by the TFTs into the sound waves, not only improving the heat dissipation efficiencies of the TFTs, effectively suppressing the temperature rise of the TFTs, and improving the operating stability and reliability of the TFTs, but also effectively eliminating the temperature difference of the TFTs at different positions, improving the uniformity of the threshold voltages Vth of the TFTs, improving the display stability of a display panel, and effectively solving the problem of different drift degrees of the threshold voltages Vth of the TFTs at different positions.

The technical solutions of the embodiments of the present disclosure will be illustrated in detail below by some embodiments.

FIG. 1 is a structural schematic diagram of some embodiments of a display substrate provided by the present disclosure, and illustrates an OLED display substrate adopting two top-gate-type TFTs. As shown in FIG. 1, a main structure of the display substrate provided by some embodiments includes a base 10, a piezoelectric layer 12 arranged on the base 10, and an array structural layer arranged on the piezoelectric layer 12 and including the TFTs, wherein the array structural layer includes a first TFT and a second TFT; the first TFT includes a first active layer 21, a first gate electrode 22, a first source electrode 23 and a first drain electrode 24; the second TFT includes a second active layer 31, a second gate electrode 32, a second source electrode 33 and a second drain electrode 34; the first active layer 21 and the second active layer 31 are arranged on the piezoelectric layer 12, namely, the first active layer 21 and the second active layer 31 are in direct contact with the piezoelectric layer 12; and the piezoelectric layer 12 in this embodiment is used for converting heat generated by the TFTs into sound waves, namely, the piezoelectric layer 12 adsorbs the heat emitted by the TFTs, and consumes up the heat in a mode of converting the heat into the sound waves.

Optionally, the display substrate provided by some embodiments includes: a base 10, a piezoelectric layer 12 formed on the base 10 and used as a barrier layer at the same time, and an array structural layer formed on the piezoelectric layer 12. The array structural layer includes a first active layer 21 and a second active layer 31 formed on the piezoelectric layer 12, a first insulation layer 13 covering the first active layer 21 and the second active layer 31, a first gate electrode 22 and a second gate electrode 32 formed on the first insulation layer 13, a second insulation layer 14 covering the first gate electrode 22 and the second gate electrode 32 and provided with two first via holes exposing the first active layer 21 and two second via holes exposing the second active layer 31, a first source electrode 23, a first drain electrode 24, a second source electrode 33 and a second drain electrode 34 which are formed on the second insulation layer 14, and a third insulation layer 15 covering the first source electrode 23, the first drain electrode 24, the second source electrode 33 and the second drain electrode 34, wherein the first source electrode 23 and the first drain electrode 24 are respectively connected with the first active layer 21 through the two first via holes formed in the second insulation layer 14, and the second source electrode 33 and the second drain electrode 34 are respectively connected with the second active layer 31 through the two second via holes formed in the second insulation layer 14. Generally, the first insulation layer 13 is also called as a gate insulation layer (GI), the second insulation layer 14 is also called as an interlayer insulation layer (ILD), and the third insulation layer 15 is also called as a passivation layer (PVD). Materials of the first insulation layer 13, the second insulation layer 14 and the third insulation layer 15 can be made of silicon oxide (SiOx), silicon nitride (SiNx), silicon oxynitride (SiON) or a combination of the above-mentioned materials and the like, and can be combined in a form such as a single-layer form, a double-layer form, a multi-layer form or a composite layer form. Materials of the first gate electrode 22, the second gate electrode 32, the first source electrode 23, the first drain electrode 24, the second source electrode 33 and the second drain electrode 34 can be made of a metal such as molybdenum (Mo), aluminium (Al), gold (Au), titanium (Ti), platinum (Pt), ruthenium (Ru) and iridium (Ir) and an alloy thereof. A material of the piezoelectric layer 12 can adopt a piezoelectric ceramic material, such as lead zirconate titanate piezoelectric ceramic composite crystals (PZT), zinc oxide (ZnO), and aluminium nitride (AlN), and can also adopt a transparent organic piezoelectric material, such as polyvinylidene fluoride (PVDF). In some embodiments, optionally, the material of the piezoelectric layer 12 adopts the transparent polyvinylidene fluoride (PVDF), and has the thickness of 1 μm to 20 μm.

In some embodiments, the first active layer 21 and the second active layer 31 can be made of amorphous silicon (a-Si), low temperature poly-silicon (LTPS) or semiconductor oxide (Oxide), and both include a channel region and doped regions positioned on both sides of the channel region, wherein the first active layer 21 includes a channel region, light doped (LDD) regions positioned on both sides of the channel region and heavily doped (HDD) regions positioned outside the light doped drain regions to form an N-channel TFT; and the second active layer 31 includes a channel region and doped (DD) regions positioned on both sides of the channel region to form a P-channel TFT. In the two first via holes formed in the second insulation layer 14, the second insulation layer 14 and the first insulation layer 13 in the first via holes are etched away to expose the heavily doped regions on both sides of the first active layer 21, and the first source electrode 23 and the first drain electrode 24 are respectively connected with the heavily doped regions on both sides of the first active layer 21 through the two first via holes. In the two second via holes formed in the second insulation layer 14, the second insulation layer 14 and the first insulation layer 13 in the second via holes are etched away to expose the doped regions on both sides of the second active layer 31, and the second source electrode 33 and the second drain electrode 34 are respectively connected with the doped regions on both sides of the second active layer 31 through the two second via holes.

Figure 2A:
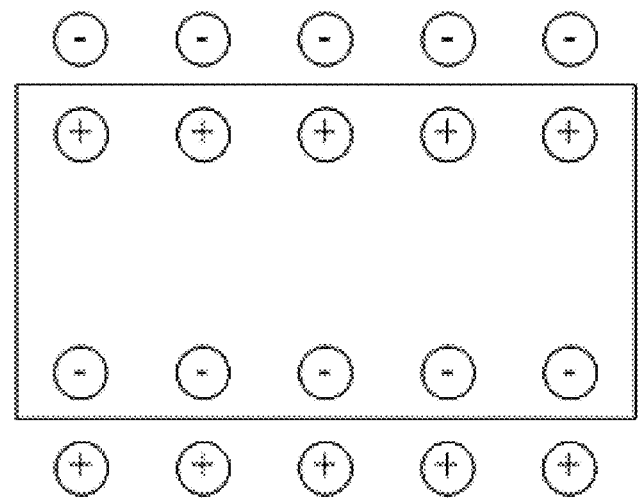
FIG. 2A and FIG. 2B are schematic diagrams of a pyroelectric effect of a piezoelectric material.
Figure 2B:
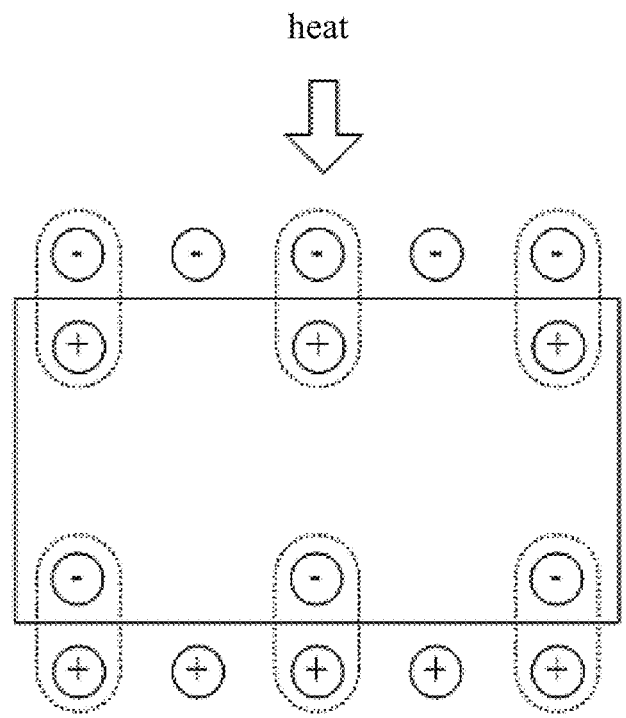

FIG. 2A and FIG. 2B are schematic diagrams of a pyroelectric effect of the piezoelectric material. Research shows that the piezoelectric material has the pyroelectric effect, and the pyroelectric effect refers to a charge release phenomenon shown when the polarization intensity is changed with the temperature. As shown in FIG. 2A, when no heat is applied, polarization generated due to ordered arrangement of electric dipoles exists in the piezoelectric material, and is called as spontaneous polarization. As shown in FIG. 2B, for crystals with spontaneous polarization, when the crystals in the piezoelectric material are heated, the spontaneous polarization intensity is changed due to the change of the temperature, and charges bound in a dielectric medium are displaced, so that bound heterocharges are generated at both ends of the piezoelectric material. The bound heterocharges generated at both ends of the piezoelectric material enable a voltage difference to be generated at both ends of the piezoelectric material, which is equivalent to that an electric field is applied to the piezoelectric material, and the piezoelectric material to which the electric field is applied mechanically vibrates and generates the sound waves.

In some embodiments, in a working process of the TFTs, the channel regions of the TFTs can generate the heat, and due to direct contact between each of the first active layer 21 and the second active layer 31 and the piezoelectric layer 13, the heat generated by the channel regions is directly transferred to the piezoelectric layer. If the channel regions of the TFTs generate relatively much heat, the temperature of the piezoelectric layer is relatively high, so that there are relatively many bound charges at both ends of the piezoelectric layer, correspondingly, the voltage difference is also relatively large, mechanical vibration of the piezoelectric layer is relatively violent, and the power of the emitted sound waves is relatively high. If the channel regions of the TFTs generate relatively little heat, the temperature of the piezoelectric layer is relatively low, so that there are relatively few bound charges at both ends of the piezoelectric layer, correspondingly, the voltage difference is also relatively small, mechanical vibration of the piezoelectric layer is relatively slight, and the power of the emitted sound waves is relatively low. In this way, the power of the sound waves of the piezoelectric layer can be changed with the quantity of the heat generated by each TFT, and then, the heat release efficiency of each TFT is approximately consistent with the heat generation efficiency, so that no matter where the TFTs are positioned and no matter how much heat is generated by the channel regions of the TFTs, the heat generated by the channel regions of the TFTs is rapidly consumed up by the piezoelectric layer through conversion into the sound waves, and the channel characteristics of the TFTs cannot be influenced by the heat generated by the channel regions. Therefore, according to the display substrate provided by this embodiment, not only are the heat dissipation efficiencies of the channel regions of the TFTs improved, the temperature rise of the channel regions of the TFTs is effectively suppressed, and the operating stability and reliability of the TFTs are improved, but also the temperature difference of the channel regions of the TFTs at different positions is effectively eliminated, the uniformity of the threshold voltages Vth of the TFTs is improved, the display stability of the display panel is improved, and the problem of different drift degrees of the threshold voltages Vth of the TFTs at different positions is effectively solved. Further, due to effective suppression on the temperature rise of the channel regions of the TFTs, the heat stresses of the channel regions of the TFTs are reduced, so that the working lives of the TFTs are effectively prolonged.

Figure 3:
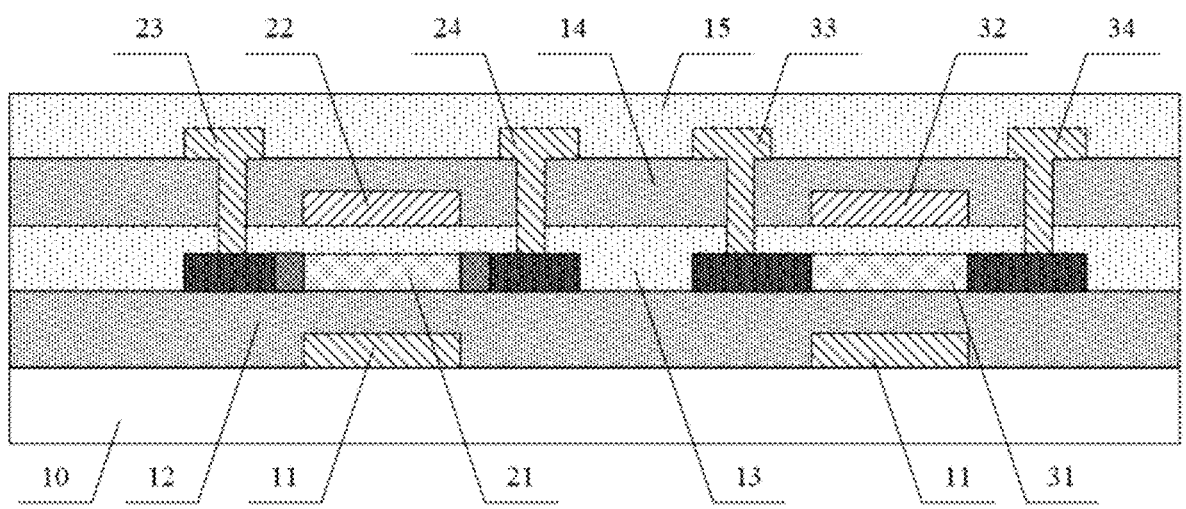
FIG. 3 is a structural schematic diagram of another embodiment of a display substrate provided by the present disclosure.

FIG. 3 is a structural schematic diagram of another embodiment of a display substrate provided by the present disclosure, and illustrates an OLED display substrate adopting two top-gate-type TFTs. As shown in FIG. 3, a main structure of the display substrate in this embodiment includes a base 10, a shielding layer 11 arranged on the base 10, a piezoelectric layer 12 arranged on the shielding layer 11, and an array structural layer arranged on the piezoelectric layer 12 and including the TFTs, wherein the array structural layer is the same with that in the above-mentioned first embodiment so as not to be repeated herein.

Different from the above-mentioned embodiments, the shielding layer 11 is arranged between the base 10 and the piezoelectric layer 12, and the shielding layer 11 is made of a metal material. In some embodiments, one of TFTs is a switching TFT, and the other one is a driving TFT; when a scanning line is turned on, a certain voltage is applied to a gate electrode of the switching TFT, and a voltage signal is transmitted to the driving TFT to turn on the driving TFT and charge a capacitor at the same time; and when the scanning line is turned off, the voltage stored in the capacitor can still keep a turn-on state of the driving TFT, and thus, a fixed current for display can be kept in one image. For the top-gate-type TFTs, the display substrate can be exposed in a light environment and light can be irradiated to the TFTs from one side of the base, and thus, by arranging a light shielding layer between the base and each of the TFTs, influences on the electrical properties of the TFTs due to illumination can be avoided.

Meanwhile, by using the light shielding layer, the efficiency of converting the heat into the sound waves by the piezoelectric layer can be improved. In some embodiments, when the temperature of the piezoelectric layer is risen to enable the bound charges to be generated at both ends of the piezoelectric layer, the shielding layer 11 arranged below the piezoelectric layer and made of the metal material is used as a charge collection electrode, so that the charges are aggregated in a region, corresponding to the shielding layer 11, of the piezoelectric layer 12 under the action of a Lorentz force. Meanwhile, a first gate electrode 22 and a second gate electrode 32 arranged above the piezoelectric layer 12 can also form one charge collection electrode, so that the charges are aggregated in regions, corresponding to the first gate electrode 22 and the second gate electrode 32, of the piezoelectric layer 12. In this way, the heat generated by the channel regions of the TFTs enables the charges generated by the piezoelectric layer 12 to be aggregated in the region corresponding to the shielding layer to the greatest extent, so that the voltage difference of the piezoelectric layer is increased, the power of the emitted sound waves is improved, and the efficiency of converting the heat into the sound waves by the piezoelectric layer is improved. In addition, even though part of residual heat is not converted by the piezoelectric layer, due to direct contact between the piezoelectric layer and the shielding layer made of the metal material, the shielding layer with excellent heat conductivity can absorb and dissipate this part of heat so as to further ensure uniformity of the temperatures of the TFTs.

In some embodiments, an electrode lead can also be arranged on the base, the shielding layer is connected with a peripheral circuit by the electrode lead, and a certain voltage is applied to the shielding layer by the peripheral circuit. In this way, the piezoelectric layer is sandwiched between the gate electrode applying a gate voltage and the shielding layer applying a shielding voltage, so that not only can the charge aggregation efficiency be further improved, but also the sound waves can be emitted under the action of the gate voltage and the shielding voltage, and furthermore, the efficiency of converting the heat into the sound waves by the piezoelectric layer is improved.

In some embodiments, the shielding layer 11 is respectively arranged below each TFT, and the position of the shielding layer 11 corresponds to that of the channel region of the active layer of the TFT. An orthogonal projection of the shielding layer 11 on the base 10 is greater than or equal to an orthogonal projection of the channel region of the active layer on the base 10, namely, the orthogonal projection of the channel region of the active layer on the base 10 is positioned in the orthogonal projection of the shielding layer 11 on the base 10. Optionally, the orthogonal projection of the shielding layer 11 on the base 10 is equal to the orthogonal projection of the channel region of the active layer on the base 10.

These embodiments not only effectively solve the problem of different drift degrees of the threshold voltages Vth of the TFTs at different positions, but also further improve the efficiency of converting the heat into the sound waves by the piezoelectric layer.

Some embodiments is illustrated by taking the OLED display substrate adopting the top-gate-type TFTs as an example, but embodiments of the present disclosure are also applicable to a LCD substrate and a corresponding sensor substrate, and is not only applicable to the top-gate-type TFTs, but also applicable to bottom-gate type TFTs. Further, according to the technical concept of the present disclosure, the technical solution of the above-mentioned embodiments can also be expanded into a plurality of expansion solutions. For example, the piezoelectric layer not only can be set as an integral film layer as mentioned in the above-mentioned embodiments, but also can be set to include a plurality of split piezoelectric blocks, the piezoelectric blocks correspond to the TFTs, and one piezoelectric block is only correspondingly arranged at the position corresponding to each TFT. For another example, the shielding layer not only can be set to include a plurality of split shielding blocks as mentioned in the above-mentioned embodiments, but also can be set as an integral shielding layer. For yet another example, a buffer layer and the like can also be arranged between the shielding layer and the piezoelectric layer, and any specific limitations to it are omitted herein in the present disclosure.

Based on the technical concept of the present disclosure, an embodiment of the present disclosure further provides a method for preparation of a display substrate. The method for preparation of the display substrate in some embodiment of the present disclosure includes:

S1: a piezoelectric layer is formed on a base; and

S2: TFTs are formed on the piezoelectric layer, and the piezoelectric layer is enabled to convert heat generated by the TFTs into sound waves.

A material of the piezoelectric layer includes lead zirconate titanate piezoelectric ceramic composite crystals (PZT), zinc oxide (ZnO), aluminium nitride (AlN) or polyvinylidene fluoride (PVDF).

The thickness of the piezoelectric layer is 1 µm to 20 µm.

In some embodiments, before step S1, the method further includes:

a shielding layer is formed on the base.

A material of the shielding layer includes a metal material.

The area of orthogonal projections of the shielding blocks on the base is greater than or equal to that of orthogonal projections of channel regions of the TFTs on the base, and the orthogonal projections of the shielding blocks completely cover the orthogonal projections of the channel regions of the TFTs.

The technical solution of embodiments of the present disclosure will be further illustrated below by a preparation process of the display substrate, wherein a "patterning process" mentioned in embodiments includes processing such as film layer deposition, photoresist coating, mask exposure, development, etching and photoresist stripping, and is a matured preparation process in the related art. Known processes such as sputtering, evaporation and chemical vapor deposition can be adopted for deposition, a known coating process can be adopted for coating, and a known method can be adopted for etching, which are not specifically limited herein.

Firstly, a pattern of a light shielding layer is formed on the base. Forming the pattern of the light shielding layer includes: a light shielding thin film is deposited on the base; the light shielding thin film is coated with a layer of photoresist, the photoresist is exposed and developed by adopting a monochroma mask, an unexposed region is formed at the position of the pattern of the light shielding layer, the photoresist is retained, fully-exposed regions are formed without the photoresist in other positions, and the light shielding thin film is exposed; and the light shielding thin film exposed out of the fully-exposed regions is etched, and the residual photoresist is stripped to form the pattern of the light shielding layer on the base, wherein the base can adopt a glass base, a quartz base or a base made of a flexible material, and the light shielding thin film can be made of one of metals such as molybdenum (Mo), aluminium (Al) and copper (Cu) and an alloy thereof.

Subsequently, a pattern of the piezoelectric layer is formed. Forming the pattern of the piezoelectric layer includes: on the base where the above-mentioned pattern is formed, a piezoelectric thin film is deposited to form the pattern of the piezoelectric layer.

Subsequently, a pattern of an active layer is formed. Forming the pattern of the active layer includes: on the base where the above-mentioned patterns are formed, an active layer thin film is deposited, and the active layer thin film is patterned by the patterning process to form the patterns of a first active layer and a second active layer, wherein the active layer thin film can be made of metal oxide or a silicon material, the metal oxide includes indium gallium zinc oxide (IGZO) or indium tin zinc oxide (ITZO), and the silicon material includes amorphous silicon and poly-silicon. The active layer thin film can also be made of the poly-silicon formed by carrying out crystallization or laser annealing and the like on amorphous silicon (a-Si).

Subsequently, patterns of gate electrodes are formed. Forming the patterns of the gate electrodes includes: on the base where the above-mentioned patterns are formed, a first insulation thin film and a gate metal thin film are sequentially deposited, and the gate metal thin film is patterned by the patterning process to form patterns of a first insulation layer covering the first active layer and the second active layer, and a first gate electrode and a second gate electrode arranged on the first insulation layer, wherein the gate metal thin film can be one of metals such as platinum (Pt), ruthenium (Ru), gold (Au), silver (Ag), molybdenum (Mo), chromium (Cr), aluminium (Al), tantalum (Ta), titanium (Ti) and tungsten (W) and an alloy thereof, and the first insulation thin film can be made of silicon oxide (SiOx), silicon nitride (SiNx) or a composite layer formed by them, and the like.

Subsequently, patterns of doped regions of the active layer are formed. Forming the patterns of the doped regions of the active layer includes: the first active layer and the second active layer are ion-doped by using the patterns of the first gate electrode and the second gate electrode as shields so as to form the patterns of the doped regions of the first active layer and the second active layer.

Subsequently, a pattern of a second insulation layer is formed. Forming the pattern of the second insulation layer includes: on the base where the above-mentioned patterns are formed, a second insulation thin film is deposited, the second insulation thin film is patterned by the patterning process to form the pattern of the second insulation layer with first via holes and second via holes, the doped region of the first active layer is respectively exposed out of two first via holes, and the doped region of the second active layer is respectively exposed out of two second via holes, wherein the second insulation thin film can be made of silicon oxide (SiOx), silicon nitride (SiNx) or a composite layer formed by them, and the like.

Subsequently, patterns of a source electrode and a drain electrode are formed. Forming the patterns of the source electrode and the drain electrode includes: on the base where the above-mentioned patterns are formed, a source-drain metal thin film is deposited, the source-drain metal thin film is patterned by the patterning process to form the patterns of a first source electrode, a first drain electrode, a second source electrode and a second drain electrode, the first source electrode and the first drain electrode are respectively connected with the doped region of the first active layer through the first via holes, and the second source electrode and the second drain electrode are respectively connected with the doped region of the second active layer through the second via holes, wherein the source-drain metal thin film can be made of one of metals such as platinum (Pt), ruthenium (Ru), gold (Au), silver (Ag), molybdenum (Mo), chromium (Cr), aluminium (Al), tantalum (Ta), titanium (Ti) and tungsten (W) and an alloy thereof.

Subsequently, on the base where the above-mentioned patterns are formed, a third insulation thin film is deposited to form a pattern of a third insulation layer covering the first source electrode, the first drain electrode, the second source electrode and the second drain electrode, wherein the third insulation thin film can be made of silicon oxide (SiOx), silicon nitride (SiNx) or a composite layer formed by them, and the like.

For an OLED display substrate, the method can further include the step that a light emitting structural layer is subsequently formed, the light emitting structural layer includes structural film layers, such as a positive pole, a pixel definition layer (PDL), a light emitting layer, a negative pole and a packaging layer, and the structure and the preparation means of the light emitting structural layers are the same with those in the related art so as not to be repeated herein.

It should be noted that the method for preparation of the display substrate in the present disclosure can also include more steps and implementation modes, it can be determined according to actual demands, there are no any limitations to it in embodiments of the present disclosure, and the detailed illustration and the technical effects of the method can refer to description of embodiments related to a detection substrate in the above, and are not repeated herein.

According to the method for preparation of the display substrate, which is provided by some embodiments of the present disclosure, the piezoelectric layer is arranged between the base and each of the TFTs, and the piezoelectric layer is used for converting the heat generated by the TFTs into the sound waves, not only improving the heat dissipation efficiencies of the channel regions of the TFTs, effectively suppressing the temperature rise of the channel regions of the TFTs, and improving the operating stability and reliability of the TFTs, but also effectively eliminating the temperature difference of the channel regions of the TFTs at different positions, improving the uniformity of the threshold voltages Vth of the TFTs, improving the display stability of a display panel, and effectively solving the problem of different drift degrees of the threshold voltages Vth of the TFTs at different positions. Further, due to effective suppression on the temperature rise of the channel regions of the TFTs, the heat stresses of the channel regions of the TFTs are reduced, so that the working lives of the TFTs are effectively prolonged. The method for preparation of the display substrate, which is provided by the embodiments of the present disclosure, can be implemented by utilizing existing matured preparation equipment, is improved a little on the basis of an existing process, can be well compatible to an existing preparation process, and has the advantages such as simple process, easiness for implementation and low production cost so as to have a wide disclosure prospect.

An embodiment of the present disclosure further improves a display device. The display device includes any one of the display substrates provided by the above-mentioned embodiments. The display device may be any product or component with a display function, such as an OLED panel, an LCD panel, a mobile phone, a tablet computer, a television, a display, a notebook computer, a digital photo frame and a navigator.

In the description of embodiments of the present disclosure, it should be understood that directional or positional relationships shown by terms such as "middle", "upper", "lower", "front", "rear", "vertical", "horizontal", "top", "bottom", "inner" and "outer" are directional or positional relationships as shown in the accompanying drawings, which only means to facilitate description of the present disclosure and simplify the description, but does not indicate or imply that the devices or components must have specific directions, or be constructed or operated in the specific directions, and thus should not be understood as a limitation to the present disclosure.

In the description of embodiments of the present disclosure, it should be noted that, unless expressly stipulated or defined, terms "mounted", "connected" and "connection" should be broadly understood as, for example, fixed connection, detachable connection, or integral connection; mechanical connection or electrical connection; or direct connection, indirect connection by a medium, or internal communication between two components. Those ordinary skilled in the art can understand specific meanings of the above-mentioned terms in the present disclosure according to specific conditions.

The implementation modes disclosed by the present disclosure are mentioned as above, but the contents are merely for facilitating understanding the present disclosure, instead of limiting the present disclosure. Those skilled in the art to which the present disclosure belongs, without departing from the spirit and scope disclosed by the present disclosure, can make any modifications and changes to the forms and details of implementation, but the scope of patent protection of the present disclosure should still be determined by the scope defined by the appended claims.

What is claimed is:

1. A display substrate, comprising a base, a piezoelectric layer arranged on the base, and thin-film transistors arranged on the piezoelectric layer, the piezoelectric layer being configured to convert heat generated by the thin-film transistors into sound waves.

2. The display substrate according to claim 1, wherein a material of the piezoelectric layer comprises lead zirconate titanate piezoelectric ceramic composite crystals, zinc oxide, aluminium nitride or polyvinylidene fluoride.

3. The display substrate according to claim 1, wherein a thickness of the piezoelectric layer is 1 μm to 20 μm.

4. The display substrate according to claim 1, wherein orthogonal projections of the thin-film transistors on the base are in an orthogonal projection of the piezoelectric layer on the base.

5. The display substrate according to claim 1, wherein the thin-film transistors comprise top-gate-type thin-film transistors, and active layers of the thin-film transistors are in direct contact with the piezoelectric layer.

6. The display substrate according to claim 1, further comprising a shielding layer, the shielding layer being arranged between the base and the piezoelectric layer.

7. The display substrate according to claim 6, wherein a material of the shielding layer comprises a metal material.

8. The display substrate according to claim 6, wherein the shielding layer comprises shielding blocks in one-to-one correspondence to the thin-film transistors, and orthogonal projections of the shielding blocks on the base overlap with orthogonal projections of the thin-film transistors corresponding to the shielding blocks on the base.

9. The display substrate according to claim 8, wherein orthogonal projections of channel regions of the thin-film transistors on the base are in the orthogonal projections of the shielding blocks corresponding to the thin-film transistors on the base.

10. The display substrate according to claim 6, further comprising an electrode lead connected with the shielding layer, the electrode lead being connected with a peripheral circuit and being configured to apply a voltage to the shielding layer.

11. A display device, comprising the display substrate according to claim 1.

12. A method for preparation of a display substrate, comprising:

forming a piezoelectric layer on a base; and forming thin-film transistors on the piezoelectric layer, and enabling the piezoelectric layer to convert heat generated by the thin-film transistors into sound waves.

13. The method for preparation according to claim 12, wherein a material of the piezoelectric layer comprises lead zirconate titanate piezoelectric ceramic composite crystals, zinc oxide, aluminium nitride or polyvinylidene fluoride.

14. The method for preparation according to claim 12, wherein a thickness of the piezoelectric layer is 1 µm to 20 µm.

15. The method for preparation according to claim 12, wherein before the forming the piezoelectric layer on the base, the method further comprises:

forming a shielding layer on the base.

16. The method for preparation according to claim 15, wherein a material of the shielding layer comprises a metal material.

\* \* \* \* \*